United States Patent
Doikas et al.

(10) Patent No.: US 6,223,431 B1
(45) Date of Patent: May 1, 2001

(54) METHOD FOR PROVIDING AN ELECTRICAL GROUND CONNECTION BETWEEN A PRINTED CIRCUIT BOARD AND A METALLIC SUBSTRATE

(75) Inventors: Peter Doikas, Arlington Heights; David Geis, Niles; Jeffrey D. Merwin, Buffalo Grove, all of IL (US)

(73) Assignee: Osram Sylvania Inc., Danvers, MA (US)

( * ) Notice: Subject to any disclaimer, the term of this patent is extended or adjusted under 35 U.S.C. 154(b) by 0 days.

(21) Appl. No.: 09/086,235

(22) Filed: May 28, 1998

(51) Int. Cl.$^7$ ........................................................ H01R 9/00
(52) U.S. Cl. ........................ 29/843; 29/844; 29/845
(58) Field of Search ........................... 29/843, 828, 827, 29/838, 841, 852, 853, 844, 845; 174/267, 264

(56) References Cited

U.S. PATENT DOCUMENTS

| | | |
|---|---|---|
| 3,397,453 | 8/1968 | Gwyn, Jr. . |
| 4,110,904 | 9/1978 | Johnson . |
| 5,275,970 * | 1/1994 | Itoh et al. ............................ 437/183 |
| 5,295,299 | 3/1994 | Takahashi . |
| 5,661,088 | 8/1997 | Tessier et al. . |

FOREIGN PATENT DOCUMENTS

| | | | |
|---|---|---|---|
| 2734461 * | 2/1979 | (DE) | ........................................ 29/845 |
| 646314 | 11/1950 | (GB) . | |

* cited by examiner

*Primary Examiner*—Lee Young
*Assistant Examiner*—Minh Trinh
(74) *Attorney, Agent, or Firm*—Carlo S. Bessone

(57) ABSTRACT

A method (100) for providing an electrical ground connection between a printed circuit board (700) and a metallic substrate (200) comprises the steps of: (i) providing an aperture (204) in the substrate (200); (ii) forming a ground plug (302) out of a metallic blank (300); (iii) inserting the ground plug (300) into the aperture in the substrate (200); (iv) compressing the ground plug (302) into the aperture (204) in the substrate (200); (v) placing the printed circuit board (700) onto the substrate (200); and (vi) applying solder into the aperture in the printed circuit board (700) and onto the ground plug (302). The steps of forming (104), inserting (106), and compressing (108) are carried out in a single punching operation (120). The method (100) efficiently provides a high quality electrical ground connection and avoids any need for sophisticated machinery.

1 Claim, 5 Drawing Sheets

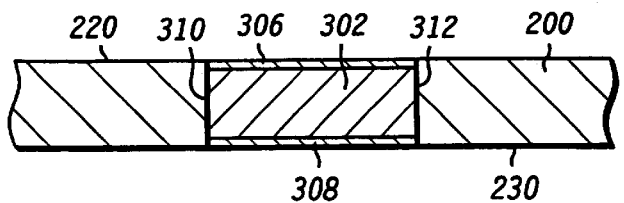
FIG. 8
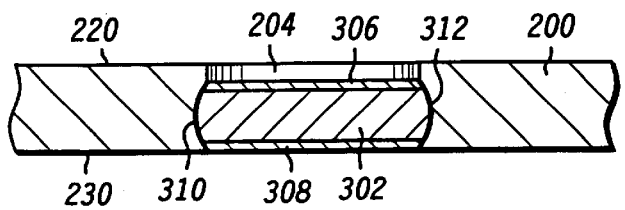
FIG. 9
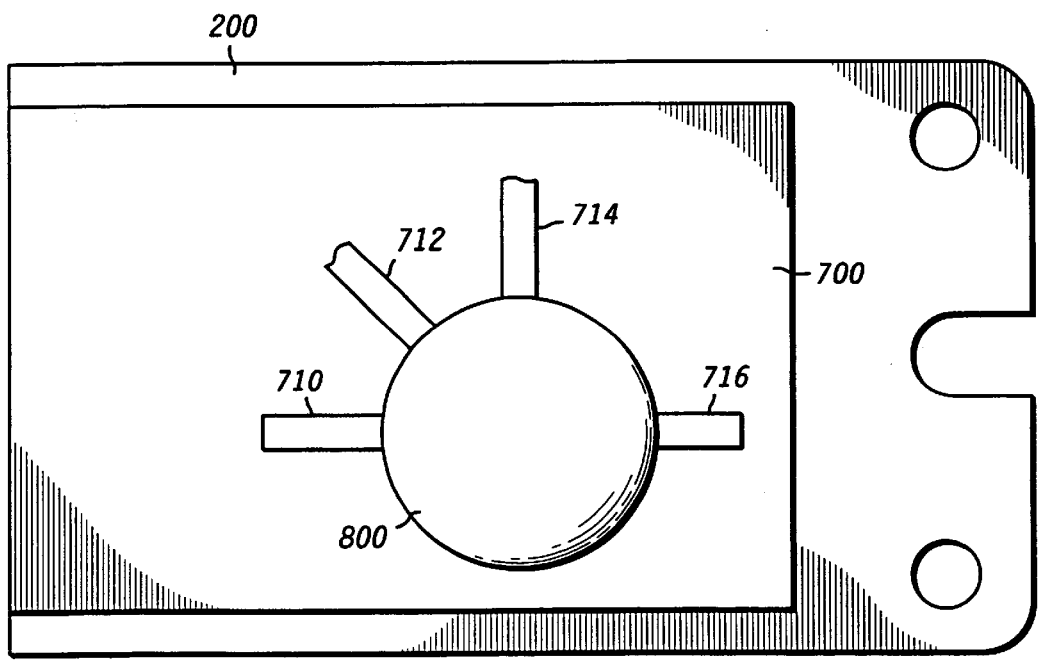
FIG. 10
FIG. 11
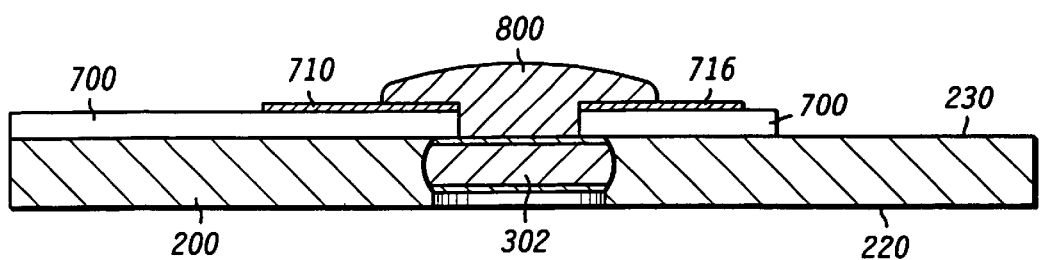

METHOD FOR PROVIDING AN ELECTRICAL GROUND CONNECTION BETWEEN A PRINTED CIRCUIT BOARD AND A METALLIC SUBSTRATE

FIELD OF THE INVENTION

The present invention relates to the general subject of electronic circuit assemblies and processes used in the fabrication thereof. More particularly, the present invention relates to a method for providing an electrical ground connection between a printed circuit board and a metallic substrate.

BACKGROUND OF THE INVENTION

Many types of electronic devices, such as electronic ballasts for gas discharge lamps, require an electrical ground connection between a printed circuit board and a metallic base or substrate. Typically, the metallic base or substrate is composed of a material such as galvanized steel or aluminum that is incapable of forming a reliable direct solder connection with the printed circuit board.

One of the most common arrangements for providing a ground connection employs a simple mounting screw that is driven through a hole in the printed circuit board and into a corresponding hole in the base. The printed circuit board typically includes one or more ground jumper wires for making contact with a bottom surface of the head of the screw. This approach has several disadvantages. First, it is extremely difficult to automate. Secondly, due to the amount of mechanical stress it places on the printed circuit board, it is ill-suited for assemblies with very thin circuit boards, such as flex-circuits.

An alternative approach employs flexible "tab" structures on the base. After the printed circuit board is placed onto the base, the tabs are bent or twisted into tight friction contact with the ground jumper wires. This approach is known to have significant problems, such as inadvertent fracturing of the ground jumper wires. Like the mounting screw approach, this approach is also difficult to automate and is not well-suited for assemblies that include very thin printed circuit boards.

A third approach employs a metallic ground plug having surfaces that are receptive to solder. The metallic ground plug is fabricated, and a hole is formed in the base or substrate. The prefabricated ground plug is then inserted into the hole in the substrate, and solder is deposited into a hole on the printed circuit board and onto the ground plug to form an electrical connection between the ground plug and a ground trace on the printed circuit board. This approach has the advantage of being particularly well-suited for thin printed circuit boards, since it places little physical stress on the circuit board itself.

Existing "ground plug" approaches have a number of disadvantages, however. First, since the ground plug is fabricated in an independent process, insertion of the prefabricated ground plug into the hole in the substrate usually requires complex "pick-and-place" machinery. Secondly, since a significant amount of time may elapse between the processes of fabricating the ground plug, forming the hole in the substrate, and inserting the ground plug into the hole in the substrate, significant deposition of environmental impurities and/or oxidation may occur on the contact surfaces of the ground plug and the hole in the substrate. Consequently, the quality and reliability of the resulting electrical connection between the ground plug and substrate may be unfavorably affected.

What is needed therefore is a method for providing a reliable, high quality electrical ground connection between a printed circuit board and a metallic substrate that is well-suited for high-volume automated assembly with thin printed circuit boards, that is efficient with regard to process steps and process time, and that may be implemented without a need for expensive, complicated machinery. Such a method would represent a significant advance over the prior art.

BRIEF DESCRIPTION OF THE DRAWINGS

FIG. 8 is a cross-sectional view of the ground plug and metallic substrate immediately following insertion of the ground plug into the aperture in the metallic substrate, in accordance with a preferred embodiment of the present invention.

FIG. 9 is a cross-sectional view of the ground plug and metallic substrate following compression of the ground plug into the aperture in the metallic substrate, in accordance with a preferred embodiment of the present invention.

FIG. 10 is a top view illustrating mounting of a printed circuit board onto the metallic substrate, and application of solder into an aperture of the printed circuit board and onto the ground plug, in accordance with a preferred embodiment of the present invention.

FIG. 11 is a cross-sectional view describing mounting of a printed circuit board onto the metallic substrate, and application of solder into an aperture of the printed circuit and onto the ground plug, in accordance with a preferred embodiment of the present invention.

DETAILED DESCRIPTION OF A PREFERRED EMBODIMENT

Figure 1:
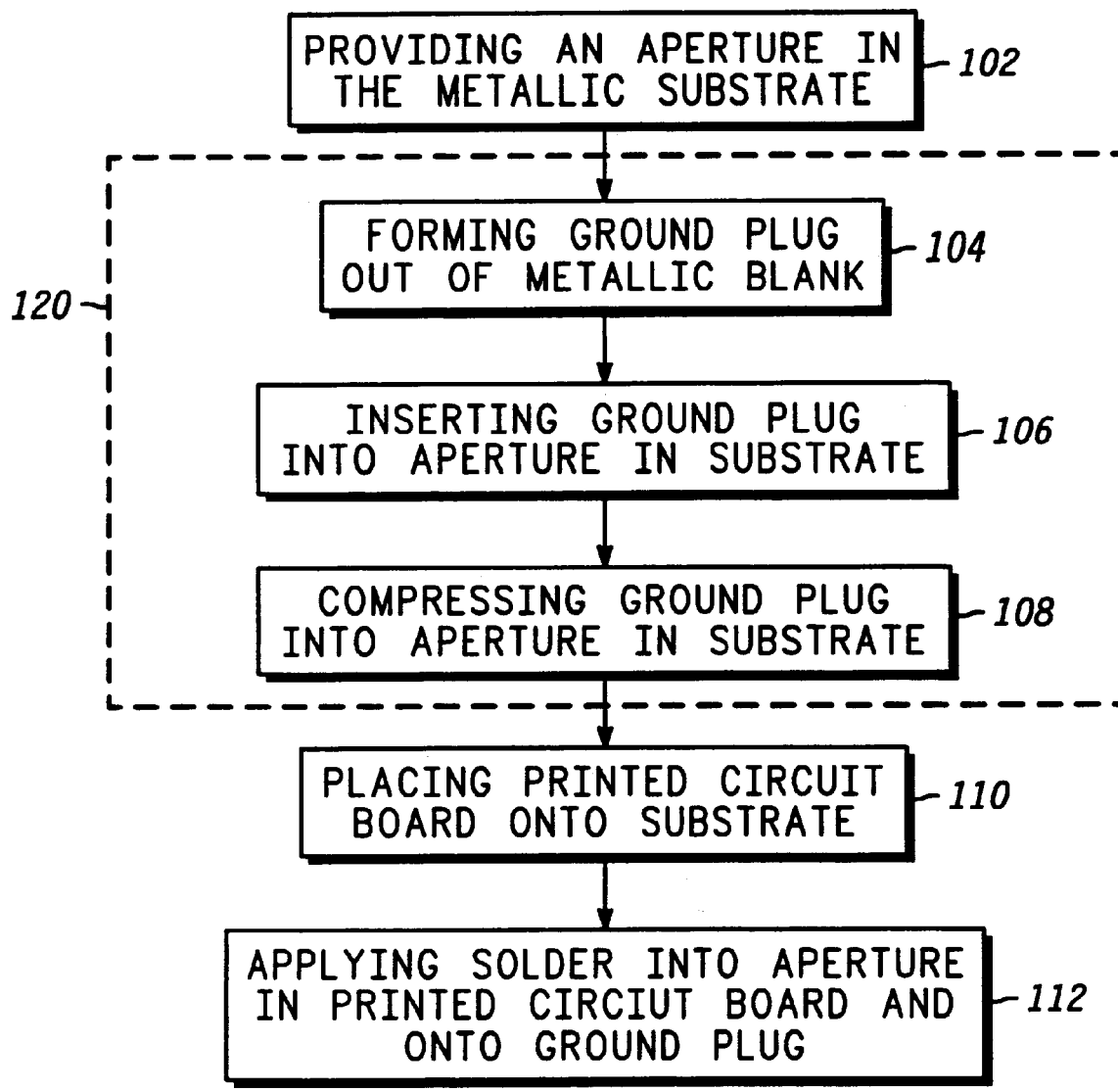
FIG. 1 is a flowchart that describes a method for providing a ground connection between a printed circuit board and a metallic substrate, in accordance with the present invention.

A method 100 for providing an electrical ground connection between a printed circuit board and a metallic substrate is described in FIG. 1. Method 100 includes the following steps:

(1) providing (102) an aperture in the substrate;
(2) forming (104) a ground plug out of a metallic blank;

(3) inserting (106) the ground plug into the aperture in the substrate;

(4) compressing (108) the ground plug into the aperture in the substrate, thereby providing an electrical connection between the ground plug and the substrate;

(5) placing (110) the printed circuit board onto the substrate such that an aperture in the printed circuit board is substantially aligned with the ground plug in the aperture in the substrate; and (6) applying (112) solder into the aperture in the printed circuit board and onto the ground plug, thereby providing an electrical connection between the ground plug and the printed circuit board.

Significantly, the steps of forming (104), inserting (106), and compressing (108) the ground plug are collectively carried out in a single punching operation 120. Consequently, method 100 may be efficiently implemented in a streamlined process that eliminates any need for special "pick-and-place" type equipment. Additionally, by making it possible to insert and compress the ground plug into the aperture in the substrate within a very short period of time after forming the substrate aperture and the ground plug, method 100 minimizes oxidation and environmental contaminants on the contact surfaces of the substrate aperture and the ground plug. This promotes high quality and reliability in the resulting electrical connection between the ground plug and the substrate.

Figure 2:
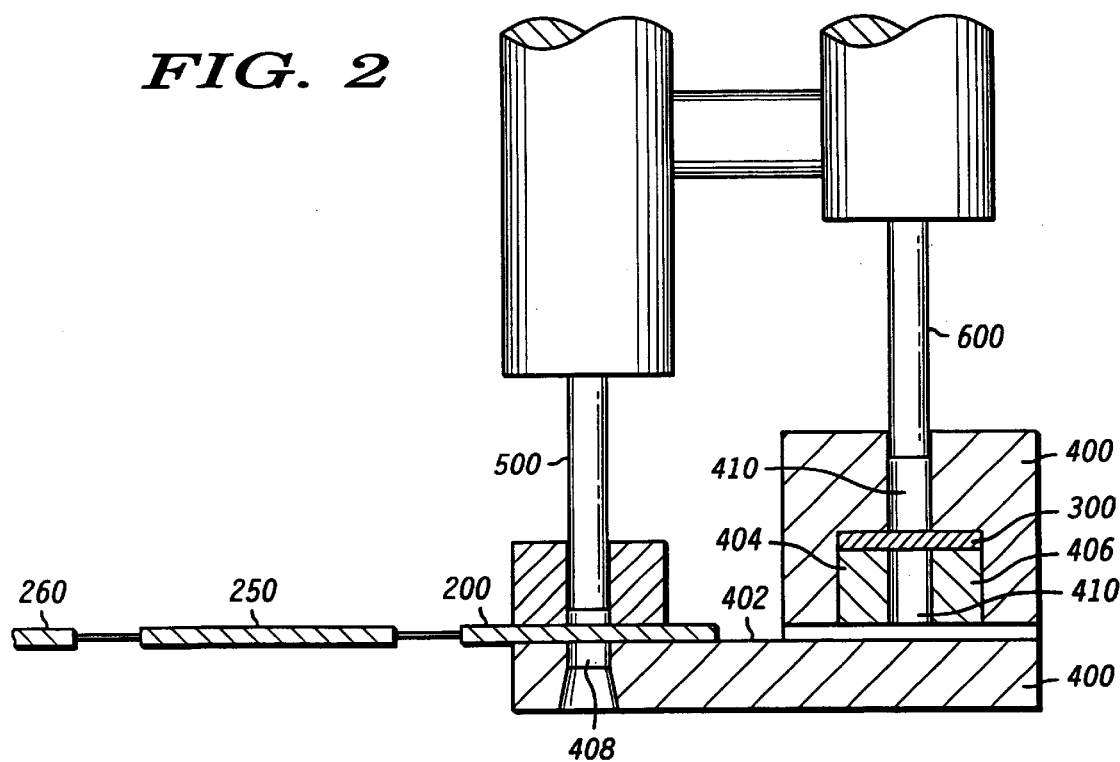
FIG. 2 is a cross-sectional view of a punch and die arrangement for implementing the method described in FIG. 1, in accordance with a preferred embodiment of the present invention.

Preferred apparatus and processes for implementing method 100 are described in FIGS. 2–11. Turning first to FIG. 2, the preferred apparatus includes a progressive die assembly 400 and a set of punches 500,600. Die assembly 400 has a surface 402 for supporting a metallic substrate 200, a shelf structure 404,406 for supporting a metallic blank 300, a first channel 408 for guiding punch 500 in forming an aperture in substrate 200, and a second channel 410 for guiding punch 600 in punching a ground plug out of metallic blank 300 and then inserting and compressing the ground plug into the aperture in substrate 200. In a practical implementation of method 100, substrate 200 is typically joined to one or more other substrates 250,260 to form a panel of substrates.

In a preferred embodiment of method 100, metallic substrate 200 is composed of aluminum and metallic blank 300 is composed of tin-plated copper. It is believed that metallic substrate 200 may alternatively be composed of other metals, such as copper, brass, and zinc. It is also believed that metallic blank 300 may alternatively be composed of other metals, such as aluminum, brass, and zinc, that are plated with tin or any of a number of metals capable of forming a reliable bond with solder.

Figure 3:
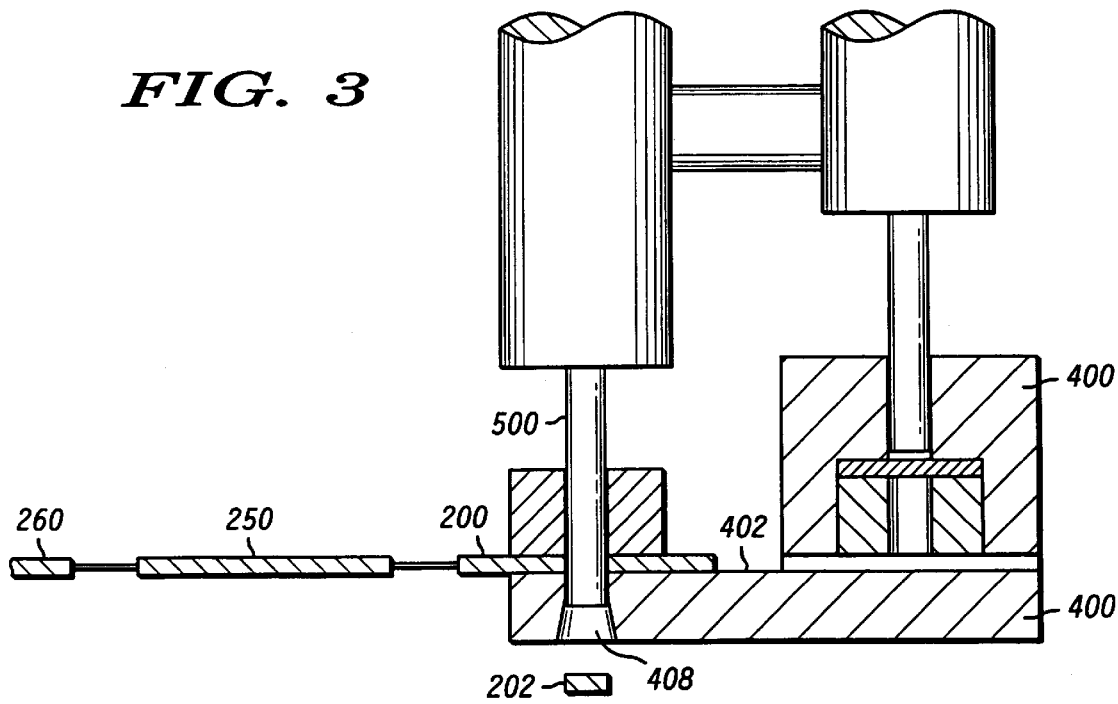
FIG. 3 describes a first punching operation, wherein an aperture is formed in a metallic substrate, in accordance with a preferred embodiment of the present invention.
Figure 4:
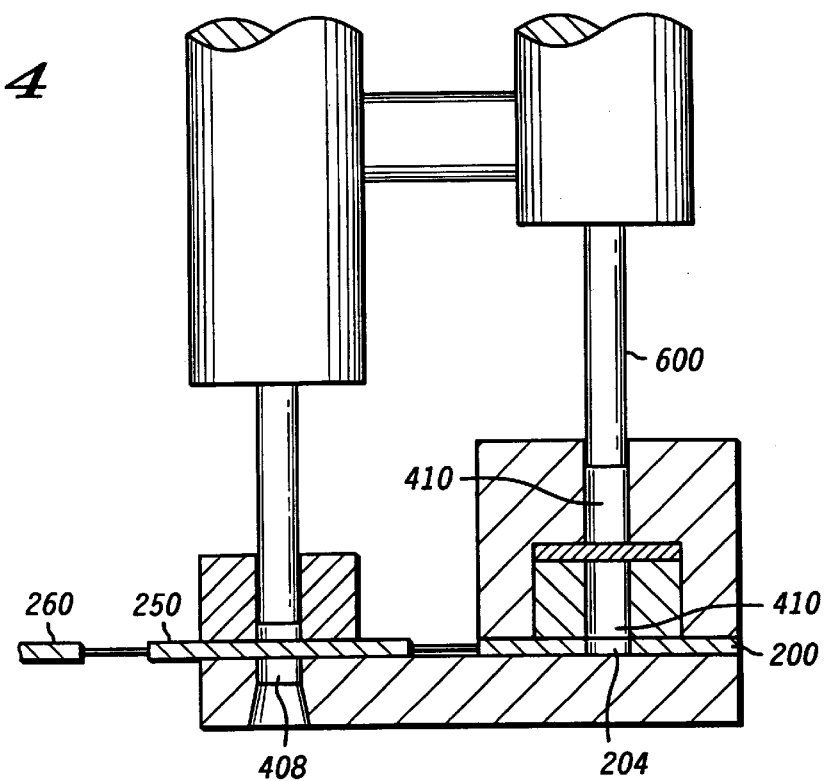
FIG. 4 describes positioning of the metallic substrate prior to a second punching operation, in accordance with a preferred embodiment of the present invention.

Turning now to FIG. 3, in a first punching operation, punch 500 is driven downward through aluminum substrate 200. Punch 500 preferably has a substantially circular cross-section, and thus forms a substantially circular aperture in substrate 200. The discarded piece of aluminum 202 is ejected from the bottom of first channel 408.

After formation of the aperture in substrate 200, punch 500 is retracted (i.e., moved upward through the aperture and back into the upper portion of first channel 408). Substrate 200 is then shifted to the right along surface 402 of die assembly 400 until the aperture is aligned with second channel 410, as described in FIG. 4. Punch 600 rests in second channel 410 and in substantial alignment with aperture 204 in substrate 200.

Figure 5:
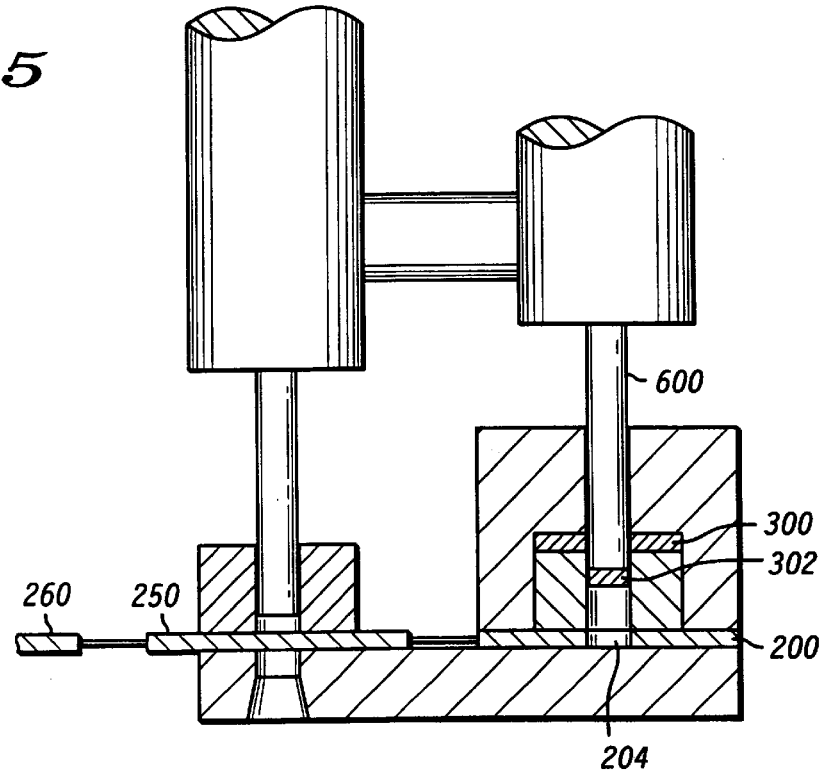
FIG. 5 describes a first portion of the second punching operation, wherein a ground plug is formed from a metallic blank, in accordance with a preferred embodiment of the present invention.
Figure 6:
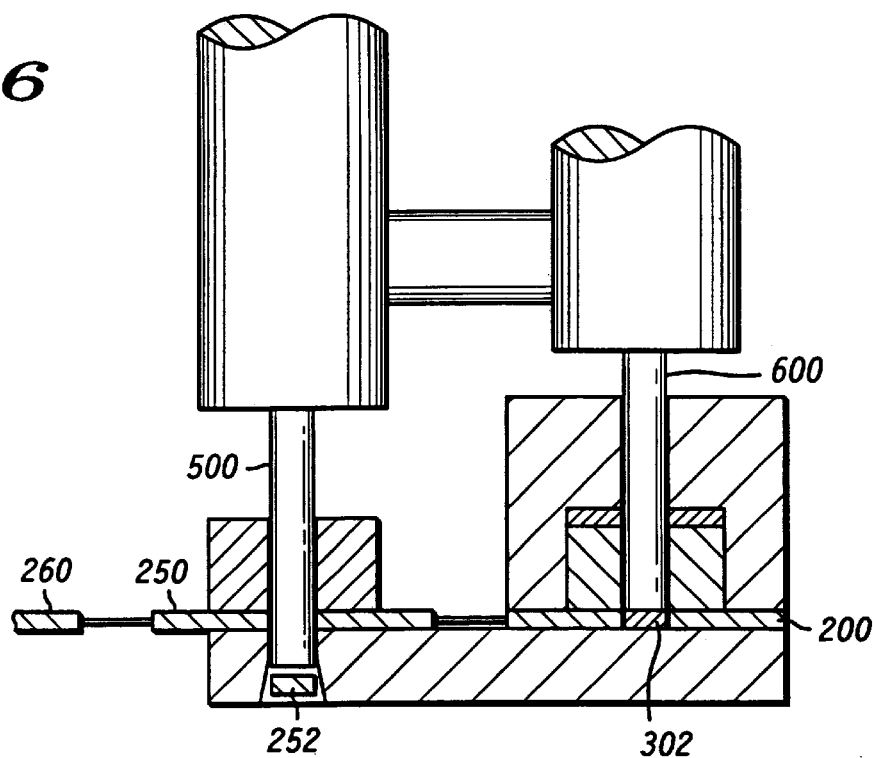
FIG. 6 describes a second portion of the second punching operation, wherein the ground plug is inserted into the aperture in the metallic substrate, in accordance with a preferred embodiment of the present invention.

Turning now to FIG. 5, with aperture 204 in position, punch 600 is driven downward in a second punching operation through blank 300. Punch 600 preferably has a substantially circular cross-section, and thus punches a substantially cylindrical ground plug 302 out of blank 300. As described in FIG. 6, punch 600 continues its downward stroke and inserts ground plug 302 into the aperture in substrate 200. At about the same time as punch 600 inserts ground plug 302, punch 500 repeats the first punching operation to form an aperture in second substrate 250. Such a parallel activity of the two punches 500,600 is advantageous since it further reduces the overall process time.

Figure 7:
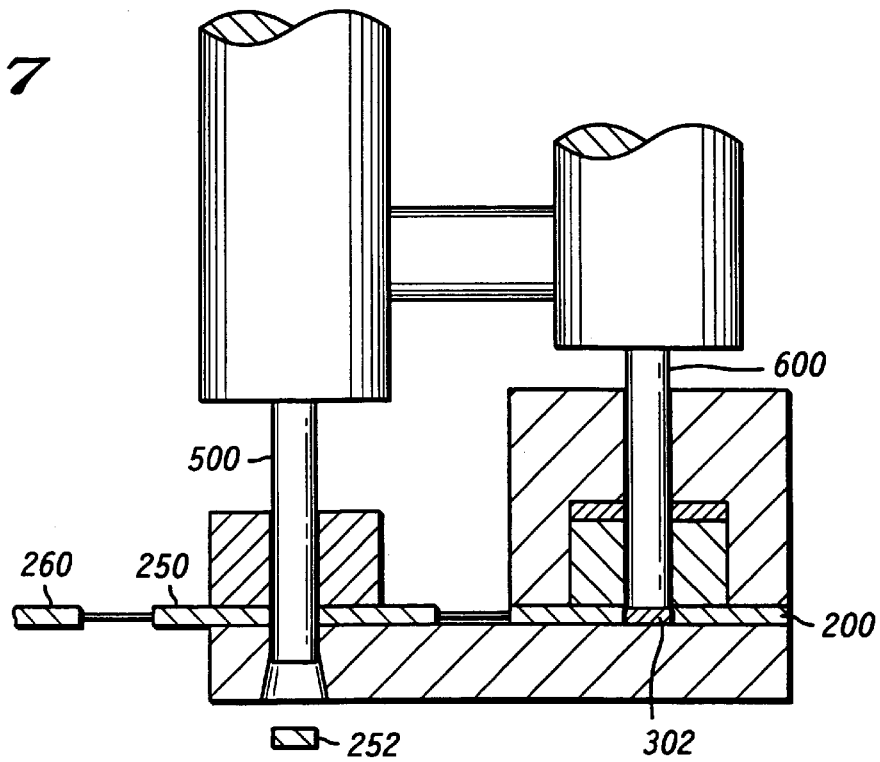
FIG. 7 describes a third portion of the second punching operation, wherein the ground plug is compressed into the aperture in the metallic substrate, in accordance with a preferred embodiment of the present invention.

As described in FIG. 7, punch 600 completes its downward stroke by compressing ground plug 302 into the aperture in substrate 200, thereby providing a compressive physical connection between ground plug 302 and substrate 200. At about the same time as punch 600 compresses ground plug 302, punch 500 completes its downward stroke and ejects the piece of aluminum 252 punched out to form an aperture in second substrate 250.

Ground plug 302 is described in detail in FIGS. 8 and 9. As alluded to previously, ground plug 302 is preferably largely composed of copper, with tin-plated top and bottom surfaces 306,308. Prior to the step of compressing, ground plug 302 has a substantially cylindrical shape, as illustrated in FIG. 8. As detailed in FIG. 9, the step of compressing causes a controlled deformation in round plug 302 and aperture 204 that causes the side-wall surfaces 310,312 of ground plug 302 to bow out and induce corresponding compressive deformation in the contact surfaces of aperture 204. The result is a gas-tight mechanical seal between the substrate 200 and at least a portion of the side-wall surfaces 310,312 of ground plug 302. which provides a high quality electrical connection that is mechanically strong and highly reliable.

Referring again to FIG. 9, upon completion of the step of compressing, the bottom surface 308 of ground plug 302 is substantially coplanar with a bottom surface 230 of substrate 200. This facilitates subsequent flush-mounting of a printed circuit board onto the bottom surface 230 of substrate 200, as well as subsequent soldering to electrically connect the printed circuit board to ground plug 302 and substrate 200.

Preferably, upon completion of the step of compressing, the top surface 306 of ground plug 302 is substantially recessed in relation to a top surface 220 of substrate 200. Accordingly, it is preferred that the metallic blank have a thickness that is no greater than that of substrate 200. In any event, it is most desirable that, after completion of the step of compressing, the top surface 306 of ground plug 302 at least not protrude beyond the top surface 220 of substrate 200. This is preferred since many product applications dictate that the top surface 220 of substrate 200 must be in substantially flush mounting contact with a heat sink or other ground plane, and protrusion of ground plug 302 beyond the top surface 220 would prevent the top surface 220 from resting solidly against another flat surface. For example, if substrate 200 is intended to serve as a base of an enclosure for an electronic ballast, the top surface 220 (i.e., the bottom of the ballast housing) should be in flush mounting contact with the lighting fixture housing so that heat can be effectively transferred from the ballast to the fixture housing (so as to keep the ballast temperature low enough to ensure adequate operating life for the ballast circuitry).

In order to minimize any contaminants or oxidation on the contact surfaces of aperture 204 and ground plug 302 which may detract from the quality of the resulting electrical connection, it is preferred that: (1) the second punching operation (i.e., the steps of forming, inserting, and compressing the ground plug) be completed within less than about two seconds after completion of the first punching operation (i.e., the step of providing an aperture in the substrate); and (2) the step of compressing be completed within less than about one second after completion of the step of forming the ground plug. It should be appreciated that, since punch 600 may be made to move downward at a considerable speed, the step of compressing the ground plug 302 may readily be completed within a fraction of a second after the ground plug 302 is punched out of metallic blank 300.

Referring back to FIG. 7, once ground plug 302 is compressed into substrate 200, punch 600 is retracted back into the upper portion of second channel 410. Second substrate 250 is then moved into position under second channel 410, metallic blank 300 is either shifted or replaced with a new blank, and the aforementioned events are repeated for forming, inserting, and compressing a ground plug into the aperture in second substrate 250.

After each of the substrates 200,250,260 in the panel are provided with a ground plug according to the process previously described, the panel is removed from die assembly 400 and printed circuit boards are then mounted onto the substrates.

As illustrated in FIGS. 10 and 11, a printed circuit board 700 is placed onto the bottom surface 230 of substrate 200 such that an aperture (not shown) in printed circuit board 700 is substantially aligned with ground plug 302 in substrate 200. Printed circuit board 700, which includes a plurality of metallic traces 710,712,714,716 disposed on an insulating material such as polyamide, is physically bonded to the bottom surface 230 of substrate 200 using a suitable pressure-sensitive adhesive. At least one of the metallic traces 710,712,714,716 is located adjacent to the aperture on printed circuit board 700 and is suited for bonding with solder. Solder 800 is then applied into the aperture in printed circuit board 700 and onto ground plug 302, thereby forming an electrical connection between ground plug 302 and printed circuit board 700. In this way, an electrical ground connection is provided between substrate 200 and traces 710,712,714,716 of circuit board 700.

The disclosed method 100 offers a number of advantages over existing approaches that employ a ground plug. In particular, method 100 efficiently combines the steps of forming, inserting, and compressing the ground plug into a single punching operation after formation of the aperture in the substrate. Consequently, process time is reduced, no special "pick-and-place" machinery is needed for inserting the ground plug, and oxidation and other impurities on the contact surfaces of the ground plug and substrate aperture are minimized. The result is a reliable, high quality electrical ground connection that is well-suited for high-volume automated manufacturing.

Although the present invention has been described with reference to a certain preferred embodiment, numerous modifications and variations can be made by those skilled in the art without departing from the novel spirit and scope of this invention.

What is claimed is:

1. A method for providing an electrical ground connection between a printed circuit board and an aluminum substrate, comprising the steps of:

(A) providing, in a first punching operation, a substantially circular aperture in the aluminum substrate;

(B) placing a metallic blank over the aperture in the aluminum substrate;

(C) positioning a punch above the metallic blank and in substantial alignment with the aperture in the aluminum substrate; and (D) driving the punch downward, in a second punching operation, through the metallic blank and into the aperture in the aluminum substrate, thereby:

(i) punching a cylindrical ground plug out of the metallic blank;

(ii) inserting the ground plug into the aperture in the aluminum substrate; and (iii) compressing the ground plug such that:

(a) a gas-tight mechanical seal is provided between the aluminum substrate and a side-wall surface of the ground plug within less than about one second after punching the ground plug out of the metallic blank;

(b) a bottom surface of the ground plug is substantially coplanar with a bottom surface of the substrate; and (c) a top surface of the ground plug is substantially recessed in relation to a top surface of the substrate;

(E) placing the printed circuit board onto the bottom surface of the aluminum substrate such that an aperture in the printed circuit board is substantially aligned with the ground plug in the aperture in the aluminum substrate, the printed circuit board including at least one metallic trace located adjacent to the aperture in the printed circuit board; and (F) applying solder into the aperture in the printed circuit board and onto the bottom surface of the ground plug, thereby providing an electrical connection between the ground plug and the at least one metallic trace of the printed circuit board.

* * * * *